United States Patent
Kim et al.

(10) Patent No.: US 10,374,157 B2
(45) Date of Patent: Aug. 6, 2019

(54) MASK FOR DEPOSITION, METHOD OF MANUFACTURING MASK, AND METHOD OF MANUFACTURING DISPLAY DEVICE

(71) Applicant: SAMSUNG DISPLAY CO., LTD., Yongin-si, Gyeonggi-do (KR)

(72) Inventors: Jeongkuk Kim, Yongin-si (KR); Minho Moon, Yongin-si (KR); Youngmin Moon, Yongin-si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 8 days.

(21) Appl. No.: 15/677,119

(22) Filed: Aug. 15, 2017

(65) Prior Publication Data

US 2018/0151803 A1   May 31, 2018

(30) Foreign Application Priority Data

Nov. 25, 2016 (KR) .......................... 10-2016-0158055

(51) Int. Cl.
| | | |
|---|---|---|
| *H01L 51/00* | (2006.01) | |
| *H01L 21/02* | (2006.01) | |
| *C23C 14/04* | (2006.01) | |
| *H01L 51/56* | (2006.01) | |
| *H01L 27/32* | (2006.01) | |

(52) U.S. Cl.
CPC ........ *H01L 51/0011* (2013.01); *C23C 14/042* (2013.01); *H01L 21/02642* (2013.01); *H01L 51/56* (2013.01); *H01L 27/3244* (2013.01); *H01L 51/001* (2013.01)

(58) Field of Classification Search
CPC ................. H01L 51/56; H01L 51/0011; H01L 21/02642; C23C 14/042
See application file for complete search history.

(56) References Cited

U.S. PATENT DOCUMENTS

| | | | | |
|---|---|---|---|---|
| 2004/0149834 A1* | 8/2004 | Shimoda | ............. | H01L 51/0005 239/135 |
| 2008/0061459 A1* | 3/2008 | Nakajima | ............. | B01F 3/0807 264/13 |
| 2012/0266813 A1* | 10/2012 | Hong | .................... | C23C 14/044 118/505 |
| 2015/0034005 A1* | 2/2015 | Ko | ......................... | C23C 14/042 118/504 |
| 2018/0277799 A1* | 9/2018 | Ikenaga | .................. | H01L 51/56 |

FOREIGN PATENT DOCUMENTS

| | | | |
|---|---|---|---|
| JP | 2010-065247 A | 3/2010 | |
| JP | 2013-163838 A | 8/2013 | |
| KR | 10-2005-0083421 A | 8/2005 | |
| KR | 10-2016-0049383 A | 5/2016 | |
| WO | WO-2017057621 A1 * | 4/2017 | ............... C25D 1/08 |

* cited by examiner

*Primary Examiner* — Feifei Yeung Lopez
(74) *Attorney, Agent, or Firm* — Lee & Morse, P.C.

(57) ABSTRACT

A mask for deposition, a method of manufacturing a mask for deposition, and a method of manufacturing a display device, the mask for deposition being coupleable to a frame with tensile force applied to opposite ends of the mask in a first direction and including a first rib portion having a first thickness; and a pattern portion including a plurality of pattern holes through which a deposition material is transmittable, and at least one etch portion, the at least one etch portion having a second thickness that is less than the first thickness and connecting between some of the plurality of pattern holes.

28 Claims, 12 Drawing Sheets

MASK FOR DEPOSITION, METHOD OF MANUFACTURING MASK, AND METHOD OF MANUFACTURING DISPLAY DEVICE

CROSS-REFERENCE TO RELATED APPLICATION

Korean Patent Application No. 10-2016-0158055, filed on Nov. 25, 2016, in the Korean Intellectual Property Office, and entitled: "Mask for Deposition, Method of Manufacturing Mask, and Method of Manufacturing Display Device," is incorporated by reference herein in its entirety.

BACKGROUND

1. Field

Embodiments relate to a mask for deposition, a method of manufacturing the mask, and a method of manufacturing a display device.

2. Description of the Related Art

Mobile electronic apparatuses are widely in use. For mobile electronic apparatuses, recently, tablet personal computers (PCs) are widely used in addition to miniaturized electronic apparatuses such as mobile phones.

To support various functions, mobile electronic apparatuses include a display device for providing visual information (such as an image) to users.

Information disclosed in this Background section was already known to the inventors before achieving the disclosure or is technical information acquired in the process of achieving the disclosure. Therefore, it may contain information that does not form the prior art that is already known to the public in this country.

SUMMARY

The embodiments may be realized by providing a mask for deposition that is coupleable to a frame with tensile force applied to opposite ends of the mask in a first direction, the mask including a first rib portion having a first thickness; and a pattern portion including a plurality of pattern holes through which a deposition material is transmittable, and at least one etch portion, the at least one etch portion having a second thickness that is less than the first thickness and connecting between some of the plurality of pattern holes.

The pattern portion may further include at least one pattern recess having a third thickness that is less than the second thickness.

The at least one pattern recess may include a plurality of pattern recesses, and the plurality of pattern recesses may be disposed in a rhombus shape.

The at least one pattern recess may include a plurality of pattern recesses, and each pattern hole may be between adjacent pattern recesses from among the plurality of pattern recesses.

Some of the plurality of pattern holes may be disposed in a rhombus shape.

The at least one etch portion may include a plurality of etch portions, and the plurality of etch portions may be spaced apart from each other in the first direction.

The at least one etch portion may include a plurality of etch portions extending along the first direction, and the plurality of etch portions may be spaced apart from each other in a second direction crossing the first direction.

The at least one etch portion may include a first etch portion extending along the first direction; and a second etch portion extending along a second direction that crosses the first direction.

The first etch portion may cross the second etch portion.

The at least one etch portion may have a zigzag shape extending along the first direction or a second direction that crosses the first direction.

The plurality of pattern holes may be disposed at vertices of the zigzag shape.

The pattern portion may have a thickness that is equal to or less than the first thickness.

The pattern portion may include a second rib portion in a region other than the pattern hole and the etch portion, the second rib portion having a thickness that is greater than the second thickness of the at least one etch portion.

The embodiments may be realized by providing a method of manufacturing a mask for deposition that includes a first rib portion and a pattern portion, the mask being coupleable to a frame with tensile force applied to opposite ends of the mask in a first direction, the method including irradiating a first laser beam to a portion of the pattern portion and forming at least one etch portion that is etched by the first laser beam; and irradiating a second laser beam to a portion of the at least one etch portion and forming a plurality of pattern holes, a deposition material being transmittable through the plurality of pattern holes.

The first rib portion may have a first thickness, and the at least one etch portion may have a second thickness that is less than the first thickness.

The first laser beam may be irradiated along a zigzag path in the first direction or a second direction that crosses the first direction.

The at least one etch portion may include a plurality of etch portions, and the plurality of etch portions may be spaced apart from each other in the first direction.

The at least one etch portion may include a plurality of etch portions, and the plurality of etch portions may be spaced apart from each other in a second direction that crosses the first direction.

The first laser beam may be continuously irradiated along the zigzag path.

The second laser beam may be irradiated to a vertex of the zigzag path.

The first laser beam may be irradiated a plurality of times along the zigzag path.

The at least one etch portion may include a first groove to which the first laser beam is irradiated once; and a second groove to which the first laser beam is irradiated twice, the second groove having a thickness that is less than a thickness of the first groove.

The second laser beam may be irradiated to the second groove, and the plurality of pattern holes may be formed in the second groove.

The first laser beam may be irradiated in the first direction and a second direction that crosses the first direction.

The at least one etch portion may include a first etch portion extending in the first direction; and a second etch portion extending in the second direction that crosses the first direction.

The first etch portion may cross the second etch portion.

The at least one etch portion may include a connection groove to which the first laser beam is irradiated once; and at least one pattern recess to which the first laser beam is irradiated twice, the at least one pattern recess having a thickness that is less than a thickness of the connection groove.

The at least one pattern recess may include a plurality of pattern recesses, and the pattern holes may be formed by irradiating the second laser beam to at least some of the plurality of pattern recesses.

The plurality of pattern holes and the plurality of pattern recesses may be alternately arranged in the first direction and the second direction.

The embodiments may be realized by providing a method of manufacturing a display device by using a mask for deposition in which the mask is coupleable to a frame with tensile force applied to opposite ends of the mask in a first direction, the method including inserting a display substrate and the mask for deposition into a chamber; and depositing a deposition material over the display substrate, the deposition material being sprayed from a deposition source and passing through the mask for deposition, wherein the mask for deposition includes a first rib having a first thickness; and a pattern portion including a plurality of pattern holes through which the deposition material is transmittable, and at least one etch portion, the at least one etch portion having a second thickness that is less than the first thickness and connecting between some of the plurality of pattern holes.

The pattern portion may further include at least one pattern recess having a third thickness that is less than the second thickness.

The at least one pattern recess may include a plurality of pattern recesses, and the plurality of pattern recesses may be arranged in a rhombus shape.

The at least one pattern recess may include a plurality of pattern recesses, and each pattern hole may be disposed between adjacent pattern recesses from among the plurality of pattern recesses.

Some of the plurality of pattern holes may be disposed in a rhombus shape.

The at least one etch portion may include a plurality of etch portions, and the plurality of etch portions may be spaced apart from each other in the first direction.

The at least one etch portion may include a plurality of etch portions, and the plurality of etch portions may be spaced apart from each other in a second direction crossing the first direction.

The at least one etch portion may include a first etch portion extending along the first direction; and a second etch portion extending along a second direction that crosses the first direction.

The first etch portion may cross the second etch portion.

The at least one etch portion may have a zigzag shape extending along the first direction or a second direction that crosses the first direction.

The plurality of pattern holes may be disposed at vertices of the zigzag shape.

The pattern portion may have a thickness that is equal to or less than the first thickness.

The pattern portion may include a second rib portion in a region other than the pattern hole and the etch portion, the second rib portion having a thickness that is greater than the second thickness of the at least one etch portion.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
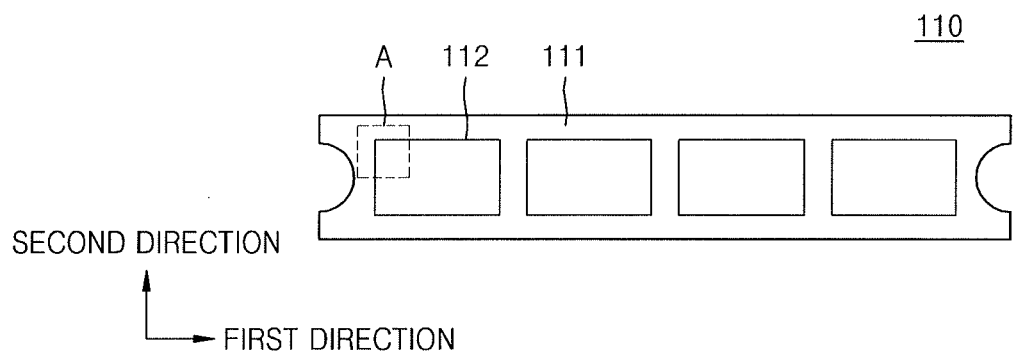
FIG. 1 illustrates a plan view of a mask for deposition according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or element, it can be directly on the other layer or element, or intervening layers may also be present. In addition, it will also be understood that when a layer is referred to as being "between" two layers, it can be the only layer between the two layers, or one or more intervening layers may also be present. Like reference numerals refer to like elements throughout.

It will be understood that although the terms "first", "second", etc. may be used herein to describe various components, these components should not be limited by these terms. These components are only used to distinguish one component from another. As used herein, the singular forms "a" "an" and "the" are intended to include the plural forms as well, unless the context clearly indicates otherwise. It will be further understood that the terms "includes," "including," "comprises," and/or "comprising" used herein specify the presence of stated features or components, but do not preclude the presence or addition of one or more other features or components.

When a certain embodiment may be implemented differently, a specific process order may be performed differently from the described order. For example, two consecutively described processes may be performed substantially at the same time or performed in an order opposite to the described order.

In embodiments, a display device may include various devices. For example, the display device may include a liquid crystal display device or an organic light-emitting display device. For convenience of description, a case where the display device is an organic light-emitting display device is mainly described below.

Figure 2:
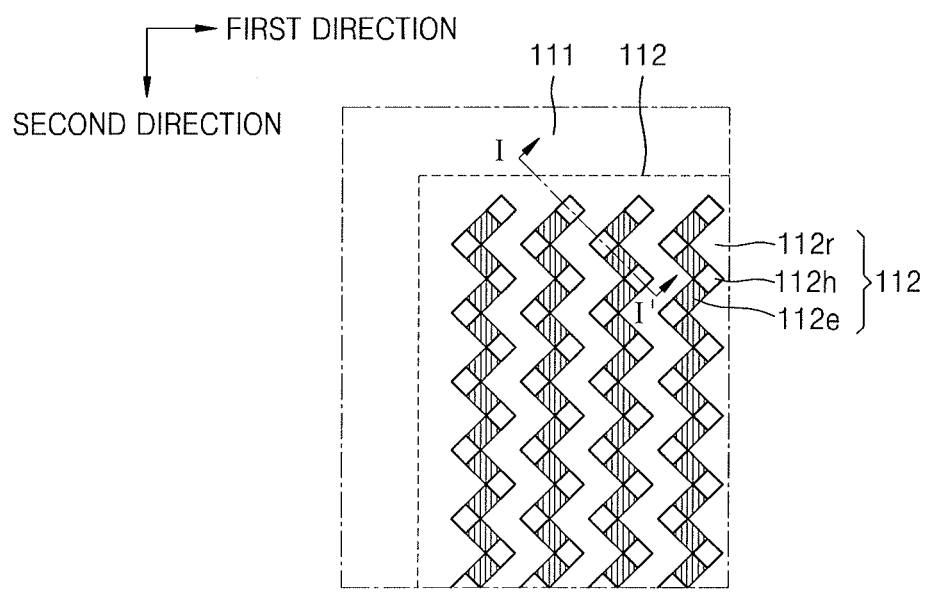
FIG. 2 illustrates an enlarged plan view of a portion A of the mask of FIG. 1.
Figure 3:
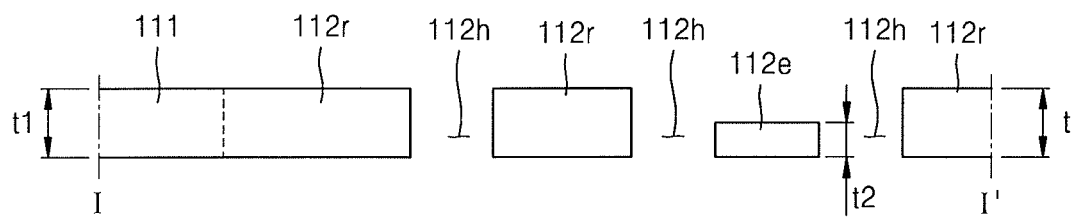
FIG. 3 illustrates a cross-sectional view of the mask taken along a line I-I' of FIG. 2.

FIG. 1 illustrates a plan view of a mask for deposition 110 according to an embodiment, FIG. 2 illustrates an enlarged plan view of a portion A of the mask 110 of FIG. 1, and FIG. 3 illustrates a cross-sectional view of the mask 110 taken along a line I-I' of FIG. 2.

Referring to FIGS. 1 to 3, the mask for deposition 110 may include a first rib portion 111 and a pattern portion 112.

The first rib portion 111 may form a body or support of the mask for deposition 110. The first rib portion 111 may have a first thickness t1 (e.g., in a deposition direction of the mask). To implement a high resolution display, a pattern of a deposition material deposited on a display substrate should be fine. For example, the mask for deposition 110 may have a thin thickness. For example, to implement a high resolution display, the first thickness t1 of the first rib portion 111 may be thin. In an implementation, the first thickness t1 may be, e.g., about 10 μm to about 50 μm. For example, the first thickness t1 of the first rib portion 111 may have a predetermined value depending on resolution of a display device to be implemented and may be less than about 10 μm depending on development of display device-related technologies afterward.

The pattern portion 112 may be defined as a region other than the first rib portion 111 in the mask for deposition 110, and may be a region of the mask through which a deposition material actually passes. The pattern portion 112 may include a plurality of pattern holes 112h (through which the deposition material is transmittable, e.g., in the deposition direction of the mask) and an etch portion 112e between or connecting some of the pattern holes 112h. In an implementation, the etch portion 112e may have a second thickness t2 (e.g., in the deposition direction of the mask) that is less than the first thickness t1 of the first rib portion 111. The pattern portion 112 may also include a second rib portion 112r forming a body of or supporting the pattern portion 112 like the first rib portion 111. For example, the the second rib portion 112r (forming the body of the pattern portion 112) and the first rib portion 111 (forming the body of the mask for deposition 110) may be different or distinct elements, the second rib portion 112r may form the body of the mask for deposition 110 in cooperation with the first rib portion 111 (e.g., the second rib portion 112r may be continuous with the first rib portion 111 to form a single, monolithic piece). For example, the second rib portion 112r and the first rib portion 111 may serve as elements giving rigidity to the mask for deposition 110.

In an implementation, the first rib portion 111 and the second rib portion 112r may have the same thickness. For example, the first thickness t1 of the first rib portion 111 may correspond or may be equal to the thickness t of the second rib portion 112r. It is noted that the thickness t of the second rib portion 112r denotes a "thickness of the pattern portion 112".

In other masks, the thickness t of the second rib portion 112r may be equal to a second thickness t2 of the etch portion 112e. In such a case, an arrangement structure of the pattern holes 112h in the pattern portion 112 could be easily transformed by external force applied to the mask for deposition 110. According to an embodiment, the rigidity of the pattern portion 112 may be secured by forming the thickness t of the second rib portion 112r to be the same as the first thickness t1 of the first rib portion 111. For example, when the thickness t of the second rib portion 112r is formed thick (e.g., as much as the first thickness t1 of the first rib portion 111), the arrangement structure of the pattern holes 112h may be prevented from being transformed by external force applied to the mask for deposition 110.

As noted above, in an implementation, the thickness t of the second rib portion 112r may be the same as the first thickness t1 of the first rib portion 111. In an implementation, the thickness t of the second rib portion 112r may substantially correspond to the first thickness t1 of the first rib portion 111 even though the thickness t of the second rib portion 112r is somewhat less than the first thickness t1 of the first rib portion 111, e.g., the thickness t of the second rib portion 112r may be about equal to the first thickness t1 of the first rib portion 111. In an implementation, the thickness t of the second rib portion 112r may be greater than at least the second thickness t2 of the etch portion 112e.

For reinforcement of the rigidity of the pattern portion 112, not only the thickness t of the second rib portion 112r but also the arrangement structure of the second rib portion 112r may be considered. A shape of the etch portion 112e may determine an arrangement structure of the second rib portion 112r, and the shape of the etch portion 112e is described below with reference to FIGS. 2 to 8.

Referring to FIG. 2, the etch portion 112e may include a plurality of etch portions 112e repeatedly arranged in a first direction, and the plurality of etch portions 112e may be spaced apart from each other in the first direction. The etch portion 112e may have a serpentine shape in the second direction. For example, the etch portion 112e may be arranged in a discontinuous zigzag or sawtooth pattern. In an implementation, the plurality of pattern holes 112h may be located at inflection points or vertices of the etch portions 112e, e.g., at the discontinuities of the discontinuous zigzag or sawtooth pattern. Referring to FIG. 3, as described above, the thickness t of the second rib portion 112r may be equal to or may otherwise correspond to the first thickness t1 of the first rib portion 111. For example, the thickness t of the second rib portion 112r may be greater than the second thickness t2 of the etch portion 112e.

Depending on the above-described structure of the etch portions 112e and the pattern holes 112h, the second rib portion 112r may include a plurality of second rib portions 112r repeatedly arranged in the first direction and the plurality of second rib portions 112r may be arranged in a connected form along the second direction. For example, the second rib portions 112r may be of one continuous piece and may include portions between the etch portions 112e that extend lengthwise in the second direction. As described above, the second rib portions 112r may be elements forming the body of the pattern portion 112. As the second rib portions 112r have the structure extending in the second direction, the second rib portions 112r may have predetermined resistive force against external force applied to the mask for deposition 110 in the second direction. For example, an effect of increasing the rigidity of the mask for deposition 110 in the second direction may be obtained via the structure of the second rib portions 112r extending in the second direction.

For example, the mask for deposition 110 may be coupled to a frame F (see FIG. 14) having a frame shape in general with tensile force applied in the first direction. In this case, the mask for deposition 110 may be stretched by a predetermined length in the first direction and the mask for deposition 110 may be contracted by a predetermined length in the second direction. In an implementation, in the case where the mask for deposition 110 having the structure of the pattern portion 112 illustrated in FIGS. 2 and 3 is stretched in the first direction, contraction of the mask for deposition 110 in the second direction may be effectively prevented. For example, the strength or rigidity of the second rib portions 112r extending lengthwise in the second direction may help ensure that the pattern portion 112 is not deformed (e.g., may help prevent the contraction in the second direction) such that the location or position of the pattern holes 112h may not vary from a desired location or position.

Next, another embodiment is described with reference to FIGS. 4 and 5.

Figure 4:
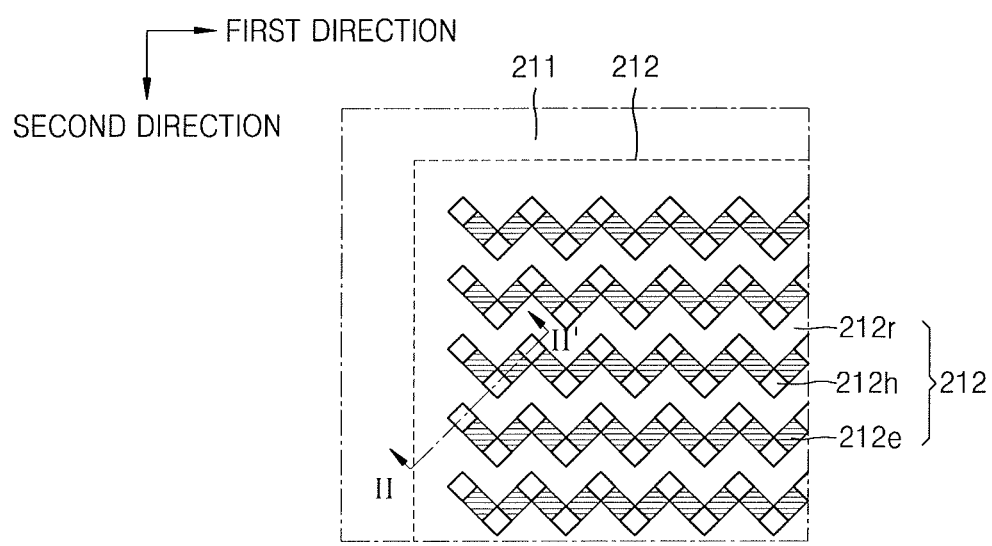
FIG. 4 illustrates an enlarged plan view of a modification of a pattern portion illustrated in FIG. 2.
Figure 5:
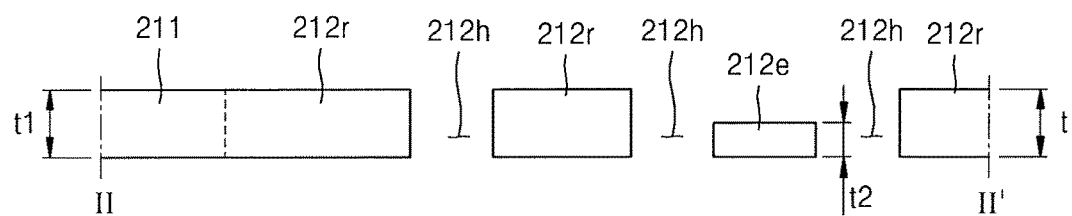
FIG. 5 illustrates a cross-sectional view of the pattern portion taken along a line II-II' of FIG. 4.

FIG. 4 illustrates an enlarged plan view of a modification of a pattern portion 212 illustrated in FIG. 2, and FIG. 5 illustrates a cross-sectional view of the pattern portion 212 taken along a line II-II' of FIG. 4.

Referring to FIG. 4, an etch portion 212e may include a plurality of etch portions 212e repeatedly arranged in the second direction (crossing the first direction). The plurality of etch portions 212e may be spaced apart from each other in the second direction. The etch portion 212e may have a serpentine shape in the first direction (e.g., may have a discontinuous zigzag or sawtooth shape or arrangement). In an implementation, a plurality of pattern holes 212h may be in inflection points or vertices of the etch portions 212e (e.g., forming the discontinuities in the discontinuous zigzag or sawtooth shape of the etch portion 212e. Referring to FIG. 5, as described above, the thickness t of a second rib portion 212r may correspond to or be about equal to a first thickness t1 of a first rib portion 211. In an implementation, the thickness t of the second rib portion 212r may be greater than a second thickness t2 of the etch portion 212e.

Based on the above-described structure of the etch portions 212e and the pattern holes 212h, the second rib portion 212r may include a plurality of second rib portions 212r repeatedly arranged in the second direction, and the plurality of second rib portions 212r may be arranged in a connected form along the first direction. For example, the second rib portions 212r may be of one continuous piece, and may include portions between the etch portions 212e extending lengthwise in the first direction. As described above, the second rib portions 212r may be elements forming a body of and supporting a structure of the pattern portion 212. As the second rib portions 212r have the structure extending in the first direction, the second rib portions 212r may have predetermined resistive force against external force applied to a mask for deposition 210 in the first direction. For example, an effect of increasing the rigidity of the mask for deposition 210 in the first direction may be obtained via the structure of the second rib portions 212r extending in the first direction.

For example, the mask for deposition 210 may be coupled to a frame F (see FIG. 14) having a frame shape in general with tensile force applied in the first direction. In this case, the mask for deposition 210 may be stretched by a predetermined length in the first direction. Therefore, in the case where the mask for deposition 210 having the structure of the pattern portion 212 illustrated in FIGS. 4 and 5 is stretched in the first direction, stretching of the mask for deposition 210 in the first direction may be effectively prevented.

Next, still another embodiment is described with reference to FIGS. 6 to 8.

Figure 6:
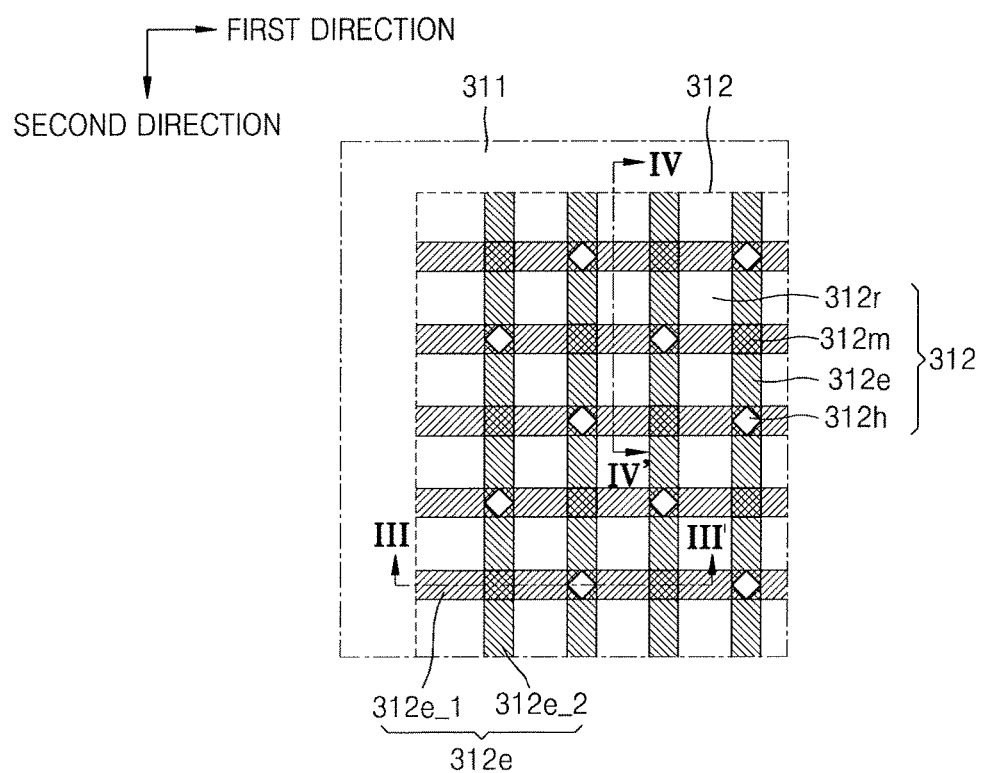
FIG. 6 illustrates an enlarged plan view of another modification of the pattern portion illustrated in FIG. 2.
Figure 7:
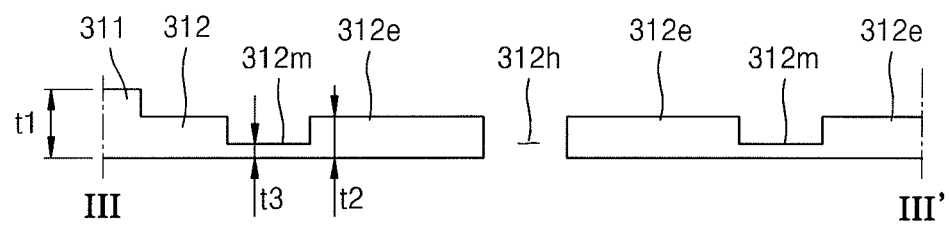
FIG. 7 illustrates a cross-sectional view taken along a line III-III' of FIG. 6.
Figure 8:
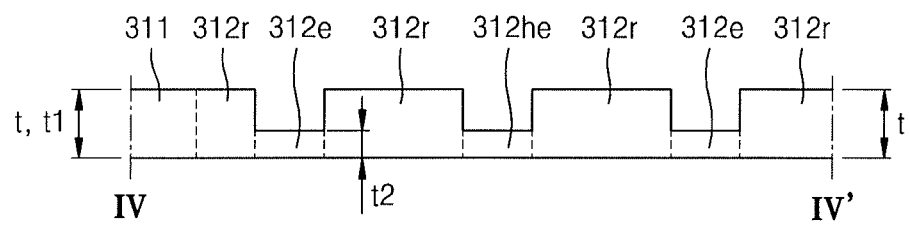
FIG. 8 illustrates a cross-sectional view taken along a line IV-IV' of FIG. 6.

FIG. 6 illustrates an enlarged plan view of another modification of the pattern portion 112 illustrated in FIG. 2, FIG. 7 illustrates a cross-sectional view of a pattern portion 312 taken along a line III-III' of FIG. 6, and FIG. 8 illustrates a cross-sectional view taken of the pattern portion 312 along a line IV-IV' of FIG. 6.

Referring to FIG. 6, the pattern portion 312 may include a pattern hole 312h, a pattern recess 312m, and an etch portion 312e. The etch portion 312e may include a first etch portion 312e_1 parallel to the first direction and a second etch portion 312e_2 parallel to the second direction (crossing the first direction). For example, the first etch portion 312e_1 may cross the second etch portion 312e_2.

A plurality of pattern holes 312h and a plurality of pattern recesses 312m may be at points at which first etch portions 312e_1 cross second etch portions 312e_2. In this case, some of the plurality of pattern holes 312h and/or some of the plurality of pattern recesses 312m may be arranged in a rhombus shape (e.g., four of the pattern holes 312h may form the vertices of a rhombus and/or four of the pattern recesses 312m may form the vertices of a rhombus). For example, each pattern recess 312m may be arranged between adjacent pattern holes 312h from among the pattern holes 312h. In an implementation, the pattern portion 312 may include a second rib portion 312r corresponding to or forming a region other than the etch portion 312e and forming a body of and/or supporting a structure of the pattern portion 312.

Referring to FIG. 7, the etch portion 312e may have a second thickness t2. The second thickness t2 may be less than a first thickness t1 of a first rib portion 311. In an implementation, the pattern recess 312m may have a third thickness t3. The third thickness t3 may be less than the second thickness t2 of the etch portion 312e.

Also, referring to FIG. 8, the second rib portion 312r may have a thickness t corresponding or about equal to the first thickness t1 of the first rib portion 311. In an implementation, the etch portion 312e may have the second thickness t2 that is less than the first thickness t1 of the first rib portion 311 and the thickness t of the second rib portion 312r.

A mask for deposition 310 having the pattern portion 312 illustrated in FIGS. 6 to 8 may have a predetermined resistive force against external force applied to the mask for deposition 310 in the first direction and the second direction via the second rib portion 312r having the thickness t substantially corresponding to or equal to the first thickness t1 of the first rib portion 311. Furthermore, the pattern recesses 312m between the pattern holes 312h and having the third thickness t3 may have predetermined resistive force against external force applied to the mask for deposition 310 in the first direction and the second direction by reinforcing the rigidity of the mask for deposition 310.

Hereinafter, a method of manufacturing the masks for deposition 110, 210, and 310 to which various modifications are applicable as described with reference to FIGS. 1 to 8 is described.

Figure 9:
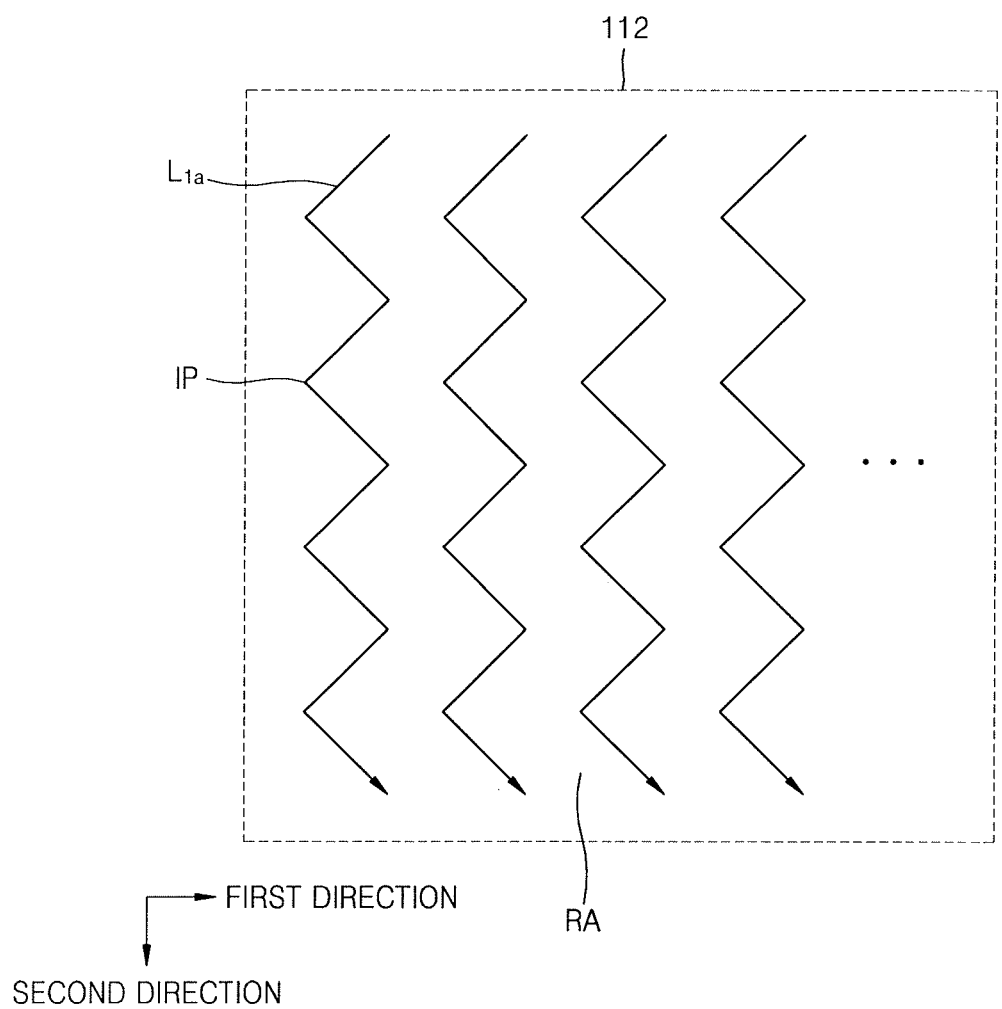
FIG. 9 illustrates an enlarged plan view of an irradiation path of a first laser beam continuously irradiated to a portion of a pattern portion in order to form an etch portion illustrated in FIG. 2.
Figure 10:
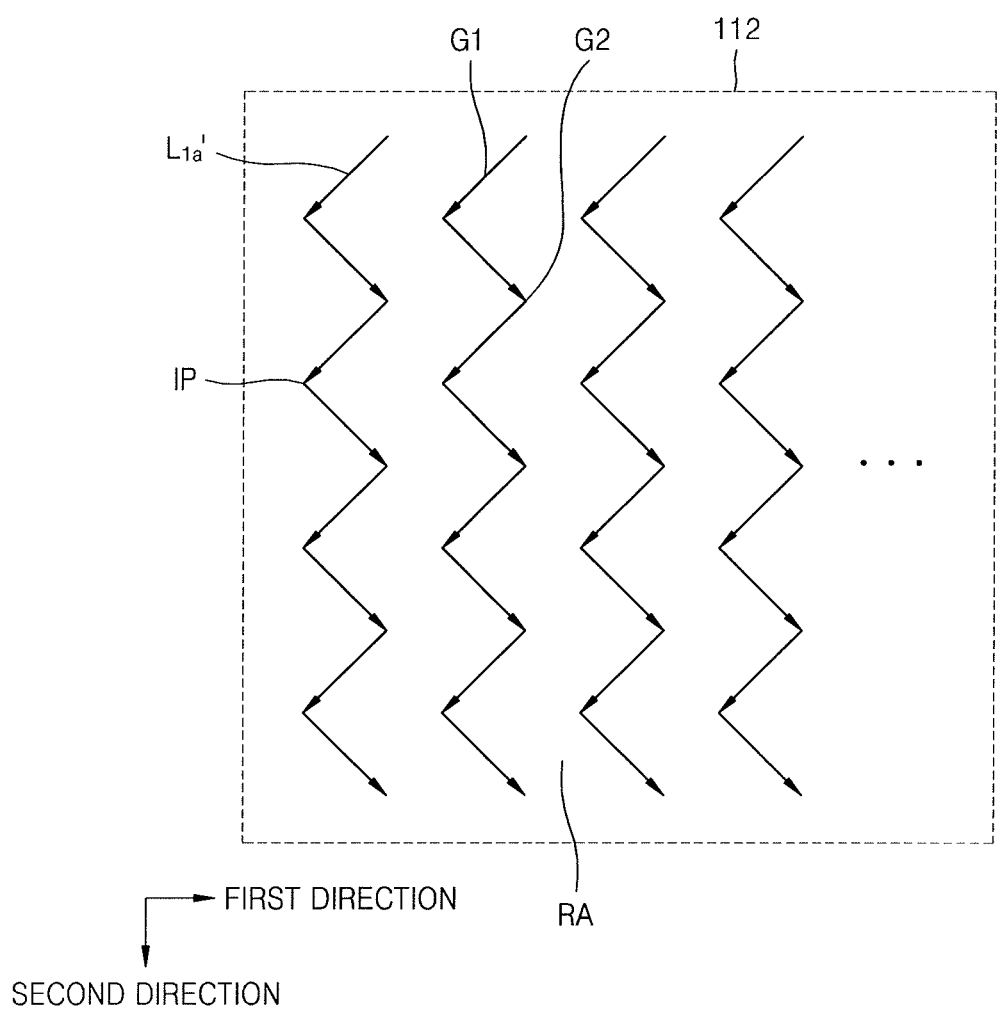
FIG. 10 illustrates an enlarged plan view of an irradiation path of a first laser beam irradiated to a portion of a pattern portion a plurality of number of times in order to form an etch portion illustrated in FIG. 2.
Figure 11:
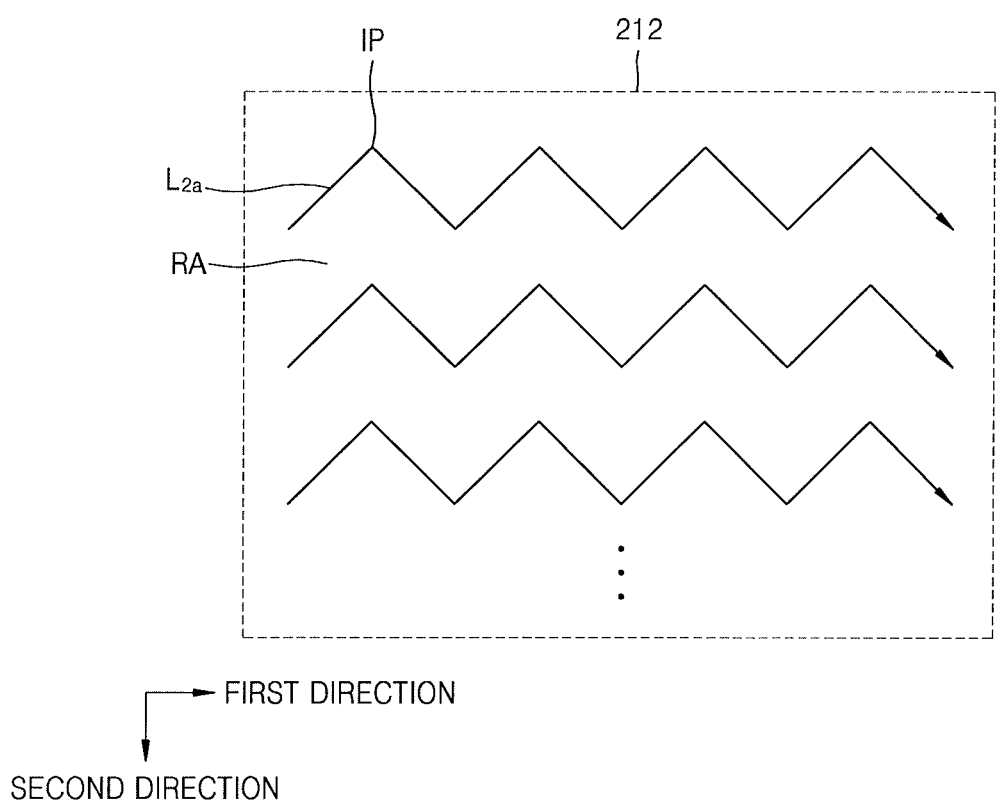
FIG. 11 illustrates an enlarged plan view of an irradiation path of a first laser beam continuously irradiated to a portion of a pattern portion in order to form an etch portion illustrated in FIG. 4.
Figure 12:
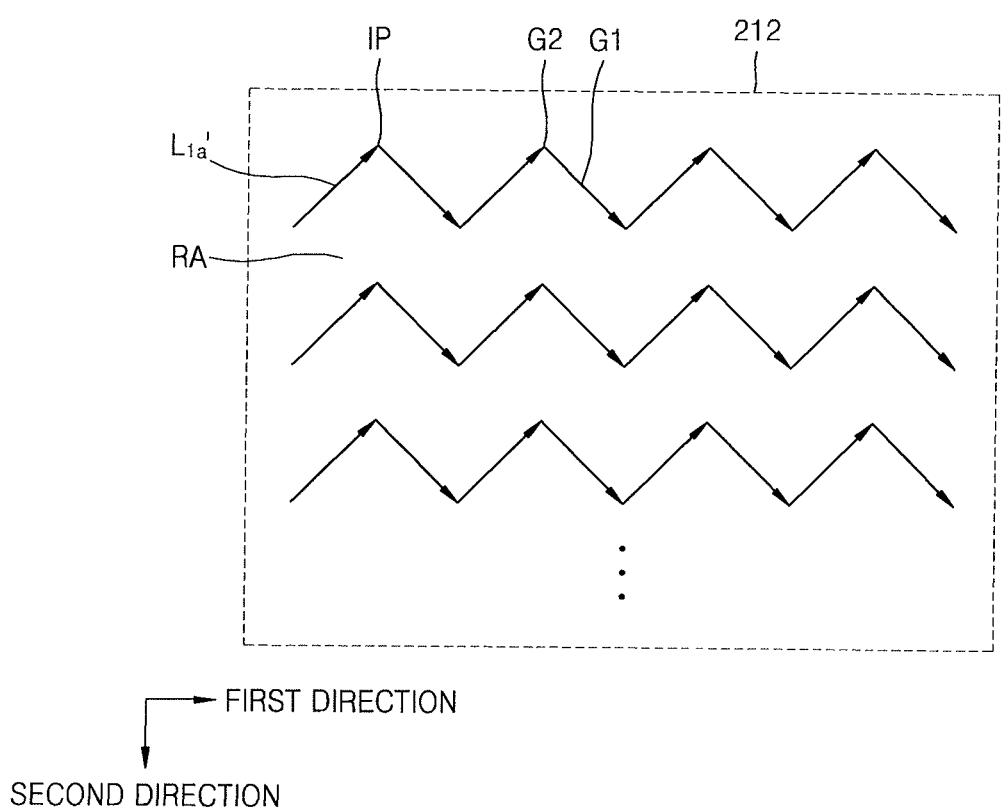
FIG. 12 illustrates an enlarged plan view of an irradiation path of a first laser beam irradiated to a portion of a pattern portion a plurality of number of times in order to form an etch portion illustrated in FIG. 4.
Figure 13:
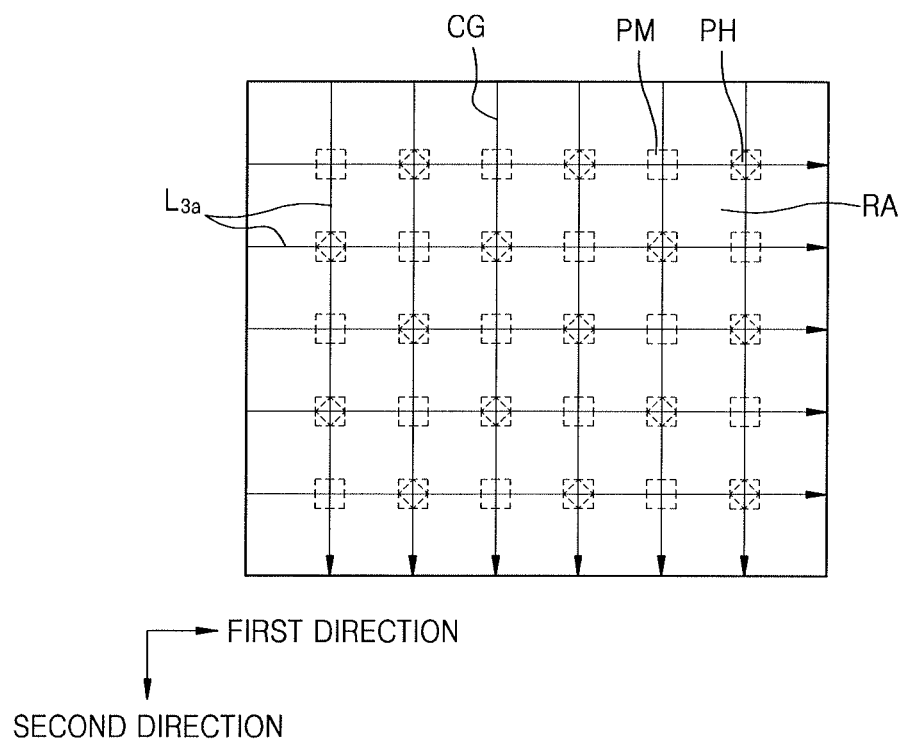
FIG. 13 illustrates an enlarged plan view of an irradiation path of a first laser beam continuously irradiated to a portion of a pattern portion in order to form an etch portion illustrated in FIG. 6.

FIG. 9 illustrates an enlarged plan view of an irradiation path of a first laser beam $L_{1a}$ continuously irradiated to a portion of the pattern portion 112 in order to form an etch portion illustrated in FIG. 2, FIG. 10 illustrates an enlarged plan view of an irradiation path of a first laser beam irradiated to a portion of a pattern portion a plurality of number of times in order to form an etch portion illustrated in FIG. 2, FIG. 11 illustrates an enlarged plan view of an irradiation path of a first laser beam continuously irradiated to a portion of a pattern portion in order to form an etch portion illustrated in FIG. 4, FIG. 12 illustrates an enlarged plan view of an irradiation path of a first laser beam irradiated to a portion of a pattern portion a plurality of number of times in order to form an etch portion illustrated in FIG. 4, and FIG. 13 illustrates an enlarged plan view of an irradiation path of a first laser beam continuously irradiated to a portion of a pattern portion in order to form an etch portion illustrated in FIG. 6.

FIG. 9 illustrates a view showing the first laser beam $L_{1a}$ being continuously irradiated to a portion of the pattern portion 112 of the mask for deposition 110 illustrated in FIG. 2. Referring to FIG. 9, the first laser beam $L_{1a}$ may be continuously irradiated along a serpentine, zigzag, or sawtooth path in a direction generally parallel to the second direction. A portion of the pattern portion 112 to which the first laser beam $L_{1a}$ has been irradiated is etched to form the etch portion 112e as illustrated in FIG. 2. In this case, the plurality of etch portions 112e may be spaced apart from each other in the first direction. Although the etch portions 112e are illustrated as one solid line in FIG. 9, this is for convenience of description. It is noted that when the first laser beam $L_{1a}$ is irradiated once or more along an irradiation path of the first laser beam $L_{1a}$ of FIG. 9, the etch portions 112e of FIG. 2 may be formed.

After the etch portions 112e are formed along the path illustrated in FIG. 9, a second laser beam may be additionally irradiated to inflection points or vertices IP of the etch portions 112e. The plurality of pattern holes 112h illustrated in FIG. 2 may be respectively formed at the vertices IP of the etch portions 112e to which the second laser beam has been additionally irradiated. In an implementation, the first laser beam $L_{1a}$ and the second laser beam may be different only in their irradiation order in that they may be used in respectively sequentially processing the etch portions 112e and the pattern holes 112h, and the first laser beam $L_{1a}$ and the second laser beam may be irradiated from substantially the same apparatus.

A region to which the first laser beam $L_{1a}$ has not been irradiated, e.g., the other region of the pattern portion 112 except the etch portion 112e, may not be etched by the first laser beam $L_{1a}$, and may remain as the original form of the pattern portion 112. This residual area RA of the pattern portion 112 may correspond to or may be the second rib portion 112r illustrated in FIG. 2. In an implementation, the second rib portion 112r may have the thickness t corresponding or about equal to the first thickness t1 of the first rib portion 111 illustrated in FIGS. 2 and 3. In the case where the second rib portion 112r has the thickness t corresponding or about equal to the first thickness t1 of the first rib portion 111, the rigidity of the mask for deposition 110 may be increased as described above.

FIG. 10 illustrates a view showing a first laser beam $L_{1a}'$ being irradiated to a portion of the pattern portion 112 of the mask for deposition 110 illustrated in FIG. 2. Referring to FIG. 10, the first laser beam $L_{1a}'$ may be irradiated a plurality of number of times along a serpentine, zigzag, or sawtooth path generally in the second direction. For example, the first laser beam $L_{1a}'$ may partially overlap at the vertices IP at which the irradiation direction changes. For example, the first laser beam $L_{1a}'$ may be discontinuously irradiated and the discontinuous separate irradiation steps may overlap at the vertices IP.

In this case, the etch portion 112e formed by the first laser beam $L_{1a}'$ may include a first groove G1 to which the first laser beam $L_{1a}'$ is irradiated once and a second groove or hole G2 to which the first laser beam $L_{1a}'$ is doubly irradiated twice. In this case, the second groove G2 may be etched by the first laser beam $L_{1a}'$ one more time than the first grooves G1, and the thickness of the second groove G2 may be less than the thickness of the first groove G1. In an implementation, the etch portion 112e may be formed as one solid line, as illustrated in FIG. 10. In an implementation, when the first laser beam $L_{1a}'$ is irradiated once or more along the irradiation path of the first laser beam $L_{1a}'$ of FIG. 10, the etch portions 112e of FIG. 2 may be formed. For example, the second groove or hole G2 may be formed at the vertices of the zigzag pattern.

After the etch portion 112e including the first groove G1 and the second groove G2 is formed by the first laser beam $L_{1a}'$, a second laser beam may be additionally irradiated to the second groove G2. The plurality of pattern holes 112h may be respectively formed in the second grooves G2 of the etch portions 112e to which the second laser beam has been additionally irradiated. In an implementation, the first laser beam $L_{1a}'$ and the second laser beam may be different only in their irradiation order in that they are used in respectively sequentially processing the etch portions 112e and the pattern holes 112h, and the first laser beam $L_{1a}'$ and the second laser beam may be irradiated from substantially the same apparatus.

A region to which the first laser beam $L_{1a}'$ has not been irradiated, e.g., the other region of the pattern portion 112 except the etch portion 112e may not be etched by the first laser beam $L_{1a}'$ but may remain as the original form of the pattern portion 112. This residual area RA of the pattern portion 112 may correspond to or may become the second rib portion 112r illustrated in FIG. 2. In an implementation, the second rib portion 112r may have the thickness t corresponding or about equal to the first thickness t1 of the first rib portion 111 illustrated in FIGS. 2 and 3. In the case where the second rib portion 112r has the thickness t corresponding or about equal to the first thickness t1 of the first rib portion 111, the rigidity of the mask for deposition 110 may be increased as described above.

FIG. 11 illustrates a view showing another modification of the irradiation path of the first laser beam $L_{1a}$ of FIG. 9 and illustrates that a first laser beam $L_{2a}$ may be continuously irradiated to a portion of the pattern portion 212 of the mask for deposition 210 of FIG. 4. Referring to FIG. 11, the first laser beam $L_{2a}$ may be continuously irradiated along a serpentine, zigzag, or sawtooth path in a direction generally parallel to the first direction. A portion of the pattern portion 112 to which the first laser beam $L_{2a}$ has been irradiated may be etched to form the etch portion 212e as illustrated in FIG. 4. In this case, the plurality of etch portions 212e may be spaced apart from each other in the second direction. In an implementation, the etch portions 212e may be in the form of one solid line, as illustrated in FIG. 11. It is noted that when the first laser beam $L_{2a}$ is irradiated once or more along an irradiation path of the first laser beam $L_{2a}$ of FIG. 11, the etch portions 112e of FIG. 4 may be formed.

After the etch portions 212e are formed along the path illustrated in FIG. 11, a second laser beam may be additionally irradiated to vertices IP of the etch portions 212e. The plurality of pattern holes 212h illustrated in FIG. 4 may be respectively formed at the vertices IP of the etch portions 212e to which the second laser beam has been additionally irradiated. In an implementation, the first laser beam $L_{2a}$ and the second laser beam may be different only in their irradiation order in that they are used in respectively sequentially processing the etch portions 212e and the pattern holes 212h, and the first laser beam $L_{2a}$ and the second laser beam may be irradiated from substantially the same apparatus.

A region to which the first laser beam $L_{2a}$ has not been irradiated, e.g., the other region of the pattern portion 212 except the etch portion 212e may not be etched by the first laser beam $L_{2a}$ but may remain as the original form of the pattern portion 212. This residual area RA of the pattern portion 212 may correspond to or be the second rib portion 212r illustrated in FIG. 4. In an implementation, the second rib portion 212r may have the thickness t corresponding or about equal to the first thickness t1 of the first rib portion 211 illustrated in FIGS. 4 and 5. In the case where the second rib portion 212r has the thickness t corresponding or about equal to the first thickness t1 of the first rib portion 211, the rigidity of the mask for deposition 210 may be increased as described above.

FIG. 12 illustrates a view showing a first laser beam $L_{2a}'$ being irradiated to a portion of the pattern portion 212 of the mask for deposition 210 illustrated in FIG. 4. Referring to FIG. 12, the first laser beam $L_{2a}'$ may be irradiated a plurality of number of times along a serpentine, zigzag, or sawtooth path generally in the first direction. For example, the first laser beam $L_{2a}'$ may partially overlap at the vertices IP at which the irradiation direction changes.

In this case, the etch portion 212e formed by the first laser beam $L_{2a}'$ may include a first groove G1 to which the first laser beam $L_{2a}'$ is irradiated once and a second groove G2 to which the first laser beam $L_{2a}'$ is irradiated twice (e.g., due to the overlap of the irradiation paths). In this case, the second groove G2 may be etched by the first laser beam $L_{2a}'$ one more time than the first grooves G1, and the thickness of the second groove G2 may be less than the thickness of the first groove G1. In an implementation, the etch portion 212e may be in the form of one solid line, as illustrated in FIG. 12. It is noted that when the first laser beam $L_{2a}'$ is irradiated once or more along the irradiation path of the first laser beam $L_{2a}'$ of FIG. 12, the etch portions 212e of FIG. 4 may be formed.

After the etch portion 212e including the first groove G1 and the second groove G2 is formed by the first laser beam $L_{2a}'$, a second laser beam may be additionally irradiated to the second groove G2. The plurality of pattern holes 212h may be respectively formed in the second grooves G2 of the etch portions 212e to which the second laser beam has been additionally irradiated. In an implementation, the first laser beam $L_{2a}'$ and the second laser beam are different only in their irradiation order in that they are used in respectively sequentially processing the etch portions 212e and the pattern holes 212h, and the first laser beam $L_{2a}'$ and the second laser beam may be irradiated from substantially the same apparatus.

A region to which the first laser beam $L_{2a}'$ has not been irradiated, e.g., the other region of the pattern portion 212 except the etch portion 212e may not be etched by the first laser beam $L_{2a}'$ but may remain as the original form of the pattern portion 212. This residual area RA of the pattern portion 212 may correspond to or be the second rib portion 212r illustrated in FIG. 4. In an implementation, the second rib portion 212r may have the thickness t corresponding or about equal to the first thickness t1 of the first rib portion 211 illustrated in FIGS. 4 and 5. In the case where the second rib portion 212r has the thickness t corresponding or about equal to the first thickness t1 of the first rib portion 211, the rigidity of the mask for deposition 210 may be increased as described above.

FIG. 13 illustrates a view showing another modification of the irradiation path of the first laser beams $L_{1a}$ and $L_{2a}$ of FIGS. 9 and 11 and shows that a first laser beam $L_{3a}$ is irradiated, in the first direction and the second direction crossing the first direction, to a portion of the pattern portion 312 of the mask for deposition 310 of FIG. 4. The first etch portion 312e_1 and the second etch portion 312e_2 of FIG. 6 may be formed in the pattern portion 312 by the first laser beam $L_{3a}$ irradiated in the first direction and the second direction. Here, the first etch portion 312e_1 and the second etch portion 312e_2 may be arranged such that the first etch portion 312e_1 crosses the second etch portion 312e_2.

The first laser beam $L_{3a}$ may be irradiated twice at a point at which the first etch portion 312e_1 crosses the second etch portion 312e_2. For example, the etch portion 312e may include a connection groove CG to which the first laser beam $L_{3a}$ is irradiated once and a pattern recess PM to which the first laser beam $L_{3a}$ is irradiated twice. Here, it is noted that the pattern recess PM of FIG. 13 is the same element or at the same location as the pattern recess 312m of FIG. 6. In an implementation, the etch portion 312e may be in the form of one solid line. It is noted that the connection groove CG and the pattern recess PM of FIG. 13 correspond to or are co-located with the final etch portion 312e and the pattern recess 312m of FIG. 6.

As described above, after the etch portion 312e including the first etch portion 312e_1 and the second etch portion 312e_2 is formed on the pattern portion 312 by the first laser beam $L_{3a}$, and the plurality of pattern recesses PM are formed at points at which the first etch portions 312e_1 cross the second etch portions 312e_2, a second laser beam may be irradiated to at least some of the pattern recesses PM. A plurality of pattern holes PH may be formed in the at least some of the pattern recesses PM to which the second laser beam has been irradiated.

Here, it is noted that the pattern holes PH of FIG. 13 are the same elements as the pattern holes 312h of FIG. 6. The pattern holes PH and the pattern recesses PM may be alternately arranged in the first direction and the second direction. For example, the pattern holes PH and the pattern recesses PM may be arranged in a rhombus shape.

In an implementation, the first laser beam $L_{3a}$ and the second laser beam may be different only in their irradiation order in that they may be used in respectively sequentially processing the etch portions 312e and the pattern holes 312h, and the first laser beam $L_{3a}$ and the second laser beam may be irradiated from substantially the same apparatus.

A region to which the first laser beam $L_{3a}$ has not been irradiated, e.g., the other region of the pattern portion 312 except the etch portion 312e may not be etched by the first laser beam $L_{3a}$ but may remain as the original form of the pattern portion 312. This residual area RA of the pattern portion 312 may correspond to or be the second rib portion 312r illustrated in FIG. 6. In an implementation, the second rib portion 312r may have the thickness t corresponding or about equal to the first thickness t1 of the first rib portion 311 illustrated in FIGS. 6 and 8. In the case where the second rib portion 312r has the thickness t corresponding or about equal to the first thickness t1 of the first rib portion 311, the rigidity of the mask for deposition 310 may be increased as described above.

Figure 14:
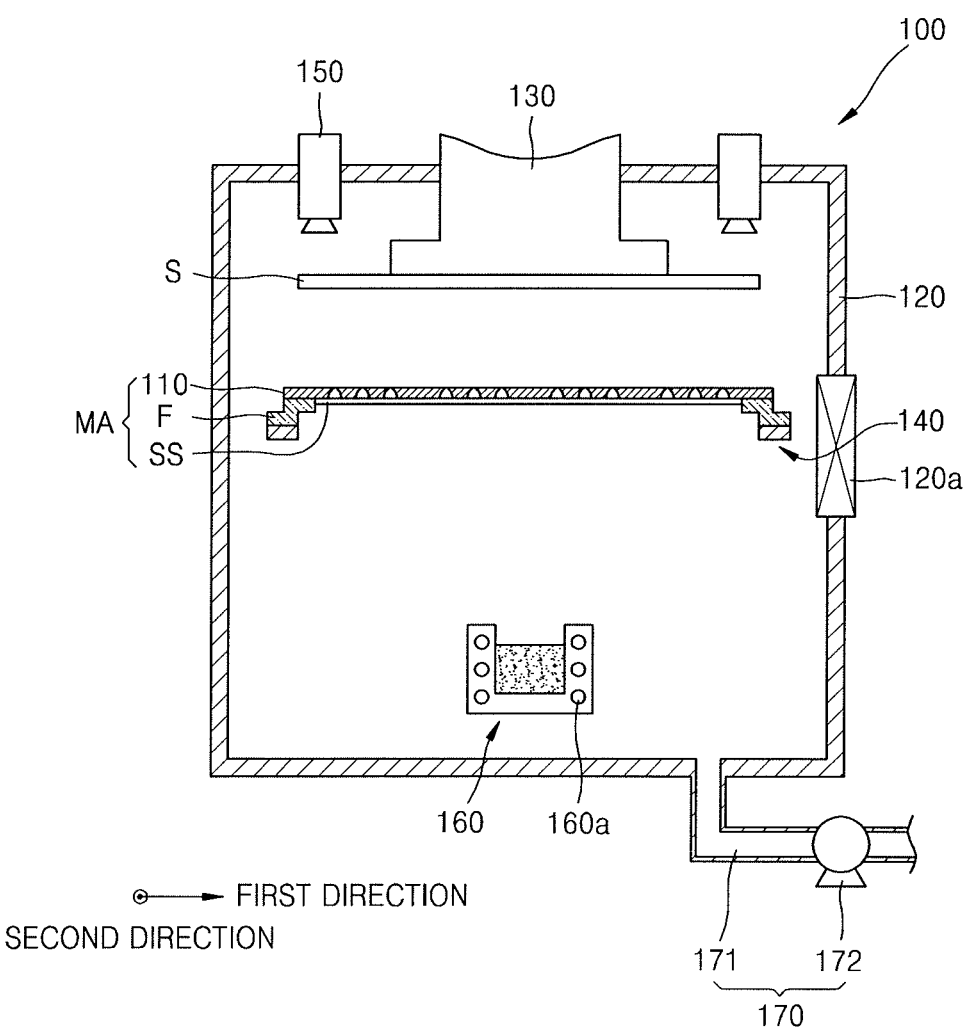
FIG. 14 illustrates a cross-sectional view of an apparatus for manufacturing a display device including the mask for deposition of FIG. 1.

Referring to FIG. 14, an apparatus 100 for manufacturing a display device may include a mask assembly for deposition MA, a chamber 120, a first support 130, a second support 140, a vision portion 150, a deposition source 160, and a pressure adjuster 170.

The mask assembly for deposition MA may include a frame F, a mask for deposition 110, and a support stick SS.

The frame F may include a plurality of frames. The frames may be configured in or have a lattice shape or a quadrangular shape or may have a cavity shape in its interim as in a frame.

For example, the frame F may define a region via or through which a deposition material passes. A plurality of masks for depositions 110 may be arranged and fixed on an upper surface of the frame F in the second direction. For example, the mask for deposition 110 may be coupled to the frame F with tensile force applied to the mask in the first direction. In an implementation, the frame F and the mask for deposition 110 may be provided separately and coupled to each other, or the frame F and the mask for deposition 110 may be formed as one body.

The mask for deposition 110 illustrated in FIG. 14 may be one of the masks for depositions 110, 210, and 310 according to the various embodiments described with reference to FIGS. 1, 2, 4, and 6. Therefore, a repeated detailed description of the mask for deposition 110 may be omitted herein. Regarding the structure of the mask for deposition 110 and an effect that may be obtained by that structure, refer to the content described with reference to FIGS. 1 to 8.

In addition to the above configuration, the mask assembly for deposition MA may further include the support stick SS provided on the frame F and supporting the mask for deposition 110. In this case, the support stick SS may be provided on the frame F such that the support stick SS is parallel to at least one of a long side and a short side of a frame F. Also, the support stick SS may be arranged in an inner space of the frame F. For example, a portion of the support stick SS may be arranged in a lengthwise direction of the mask for deposition 110 between adjacent masks for deposition 110 and prevent a deposition material from passing between the masks for deposition 110.

The chamber 120 may have a space therein and a portion of the chamber 120 may be open. A gate valve 120a may be provided to the open portion of the chamber 120 and selectively open/close the open portion of the chamber 120.

The first support 130 may support a display substrate S. In this case, the first support 130 may support the display substrate S in various manners. For example, the first support 130 may include an electrostatic chuck or an adhesive chuck. In an implementation, the first support 130 may include a bracket or a clamp supporting a portion of the display substrate S. In an implementation, the first support 130 may include all devices that may support the display substrate S. Hereinafter, for convenience of description, a case where the first support 130 includes an electrostatic chuck or an adhesive chuck is mainly described.

The mask assembly for deposition MA may be seated on and supported by the second support 140. In this case, the second support 140 may fine-adjust the mask assembly for deposition MA in at least two different directions. For example, the second support 140 may adjust a location of the mask assembly for deposition MA in the first direction or the second direction.

The vision portion 150 may capture locations of the display substrate S and the mask assembly for deposition MA. In this case, the display substrate S and the mask assembly for deposition MA may be aligned by moving at least one of the display substrate S and the mask assembly for deposition MA based on a picture taken by the vision portion 150.

A deposition material may be stored inside the deposition source 160. The deposition source 160 may include a heater 160a. The deposition material may be evaporated by heat applied from the heater 160a.

The deposition source 160 may have various shapes. For example, the deposition source 160 may be a dot-deposition source in which an entry portion via which a deposition material is discharged is circular. In an implementation, the deposition source 160 may be a long line-deposition source in which a plurality of entry portions are provided or an entry portion is a long cavity. For convenience of description, a case where the deposition source 160 is a dot-deposition source and faces one point of the mask assembly for deposition MA is mainly described below.

The pressure adjuster 170 may be connected to the chamber 120 and adjust the pressure of the inside of the chamber 120 to pressure similar to atmospheric pressure or vacuum. In this case, the pressure adjuster 170 may include a connection pipe 171 connected to the chamber 120 and a pressure-adjusting pump 172 provided to the connection pipe 171.

A method of manufacturing a display device by using the apparatus 100 for manufacturing the display device is described. The display substrate S may be manufactured and prepared.

The pressure adjustor 170 may maintain the inside of the chamber 120 to atmospheric pressure. After the gate valve 120a is opened, the display substrate S and the mask assembly for deposition MA may be inserted into the chamber 120. In this case, a separate robot arm, a shuttle, etc. may be provided inside or outside the chamber 120 and transfer the display substrate S and the mask assembly for deposition MA.

When the above process is completed, the pressure adjuster 170 may maintain the inside of the chamber 120 to almost vacuum. Also, the vision portion 150 may capture the display substrate S and the mask assembly for deposition MA, fine-drive the first support 130 and the second support 140, fine-adjust at least one of the display substrate S and the mask assembly for deposition MA, and thus align the display substrate S and the mask assembly for deposition MA.

Next, the heater 160a may operate and the deposition source 160 may spray the deposition material in a direction toward the mask assembly for deposition MA. The deposition material that has passed through the mask assembly for deposition MA may be deposited on the display substrate S in a predetermined pattern.

While the above process is performed, at least one of the deposition source 160 and the display substrate S may perform a linear motion. In an implementation, the deposition may be performed while both the deposition source 160 and the display substrate S stop. Hereinafter, a case where the deposition is performed while both the deposition source 160 and the display substrate S stop is mainly described.

Figure 15:
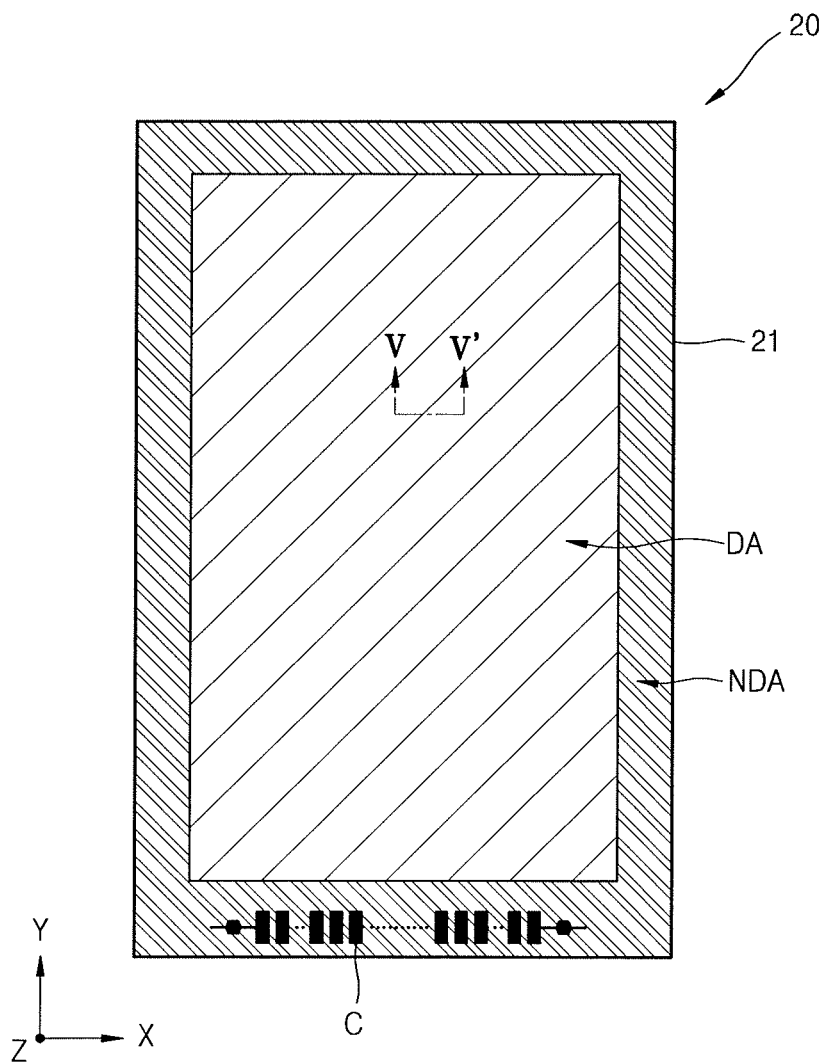
FIG. 15 illustrates a plan view of a display device manufactured by the apparatus for manufacturing a display device illustrated in FIG. 14.
Figure 16:
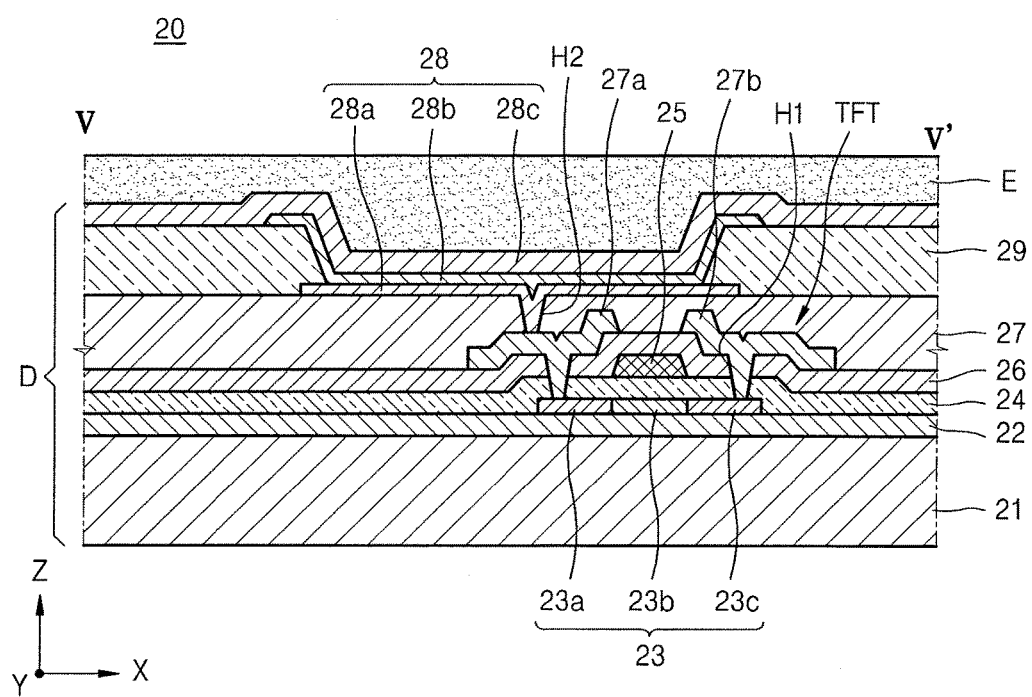
FIG. 16 illustrates a cross-sectional view of the display device taken along a line V-V' of FIG. 15.

FIG. 15 illustrates a plan view of a display device manufactured by the apparatus for manufacturing a display device illustrated in FIG. 14, and FIG. 16 illustrates a cross-sectional view of the display device taken along a line V-V' of FIG. 15.

Referring to FIGS. 15 and 16, a display device 20 may include a display area DA and a non-display area NDA outside the display area DA over a substrate 21. An emission portion is in the display area DA, and a power wiring, etc.

may be in the non-display area NDA. Also, a pad portion C may be in the non-display area NDA.

The display device 20 may include a display substrate D, an intermediate layer 28b, an opposite electrode 28c, and an encapsulation layer. In this case, the display substrate D may include the substrate 21, a buffer layer 22, a thin film transistor (TFT), a passivation layer 27, a pixel electrode 28a, and a pixel-defining layer 29. Also, the encapsulation layer may include an encapsulation substrate or a thin film encapsulation layer E which is the same as or similar to the substrate 21. In this case, in the case where the encapsulation layer includes the encapsulation substrate, a separate sealing member may be between the substrate 21 and the encapsulation substrate. Hereinafter, for convenience of description, a case where the encapsulation layer includes the thin film encapsulation layer E is mainly described.

The substrate 21 may include a plastic material or a metallic material such as SUS or Ti. In an implementation, the substrate 21 may include polyimide (PI). Hereinafter, for convenience of description, a case where the substrate 21 includes PI is mainly described.

The emission portion may be formed over the substrate 21. In this case, the TFT is provided to the emission portion. The passivation layer 27 covers the TFT. An organic light-emitting diode (OLED) 28 may be on the passivation layer 27.

The buffer layer 22 including an organic compound and/or an inorganic compound is further on the substrate 21. The buffer layer 22 may include SiOx (x≥1) or SiNx (x≥1).

After an active layer 23 arranged in a predetermined pattern is formed on the buffer layer 22, a gate insulating layer 24 buries the active layer 23. The active layer 23 includes a source region 23a and a drain region 23b and further includes a channel region 23b therebetween.

The active layer 23 may include various materials. For example, the active layer 23 may include an inorganic semiconductor material such as amorphous silicon or crystalline silicon. In an implementation, the active layer 23 may include an oxide semiconductor. In an implementation, the active layer 23 may include an organic semiconductor material. Hereinafter, for convenience of description, a case where the active layer 23 includes amorphous silicon is mainly described.

The active layer 23 may be formed by forming an amorphous silicon layer on the buffer layer 22, then crystallizing the amorphous silicon layer to form a polycrystalline silicon layer, and patterning the polycrystalline silicon layer. The source region 23a and the drain region 23b of the active layer 23 are doped with impurities depending on TFT kinds of a driving TFT, a switching TFT, etc.

A gate electrode 25 corresponding to the active layer 23, and an interlayer insulating layer 26 burying the gate electrode 25 are formed on an upper surface of the gate insulating layer 24.

Also, after contact holes H1 are formed in the interlayer insulating layer 26 and the gate insulating layer 24, a source electrode 27a and a drain electrode 27b are formed on the interlayer insulating layer 26 such that the source electrode 27a and the drain electrode 27b respectively contact the source region 23a and the drain region 23b.

The passivation layer 27 is formed on the above-described TFT. The pixel electrode 28a of the OLED 28 is formed on the passivation layer 27. The pixel electrode 28a contacts the drain electrode 27b of the TFT via a contact hole H2 in the passivation layer 27. The passivation layer 27 may include a single layer or two or more layers including an inorganic material and/or an organic material. The passivation layer 27 may be a planarization layer in which an upper surface of the passivation layer 27 is planarized regardless of bending of a lower layer, or may be a curved layer depending on bending of the lower layer. In an implementation, the passivation layer 27 may include a transparent insulator to accomplish a resonance effect.

After the pixel electrode 28a is formed on the passivation layer 27, the pixel-defining layer 29 covering the pixel electrode 28a and the passivation layer 27 and including an inorganic material and/or an organic material is formed and is open to expose the pixel electrode 28a.

In an implementation, the intermediate layer 28b and the opposite electrode 28c are on at least the pixel electrode 28a.

The pixel electrode 28a serves as an anode electrode, and the opposite electrode 28c serves as a cathode electrode. The polarities of the pixel electrode 28a and the opposite electrode 28c may be readily reversed.

The pixel electrode 28a is insulated from the opposite electrode 28c by the intermediate layer 28b. Light emission is generated in an organic emission layer by applying voltages of different polarities to the intermediate layer 28b.

The intermediate layer 28b may include the organic emission layer. In an implementation, the intermediate layer 28b may include the organic emission layer and further include at least one of a hole injection layer (HIL), a hole transport layer (HTL), an electron transport layer (ETL), and an electron injection layer (EIL) in addition to the organic emission layer. In an implementation, the intermediate layer 28b may include the organic emission layer and further include various other functional layers.

In this case, the intermediate layer 28b may be formed by the apparatus for manufacturing the display device described with reference to FIG. 14.

Meanwhile, one unit pixel includes a plurality of sub-pixels. The sub-pixels may emit light of various colors. For example, the sub-pixels may include sub-pixels respectively emitting red, green, and blue light, or include sub-pixels respectively emitting red, green, blue, and white light.

The thin film encapsulation layer E may include a plurality of inorganic layers or include an inorganic layer and an organic layer.

The organic layer of the thin film encapsulation layer E includes a polymer and may be a single layer or a layer stack including any one of polyethylene terephthalate (PET), PI, polycarbonate (PC), epoxy, polyethylene, and polyacrylate. The organic layer may include polyacrylate, and may include a polymerized monomer composition including diacrylate-based monomer and triacrylate-based monomer. The monomer composition may further include monoacrylate-based monomer. In an implementation, the monomer composition may further include a photoinitiator such as trimethyl benzoyl diphenyl phosphine oxide (TPO).

The inorganic layer of the thin film encapsulation layer E may be a single layer or a layer stack including a metallic oxide or a metallic nitride. For example, the inorganic layer may include one of SiNx, $Al_2O_3$, $SiO_2$, and $TiO_2$.

An uppermost layer of the thin film encapsulation layer E exposed to outside may include an inorganic layer in order to prevent moisture transmission of the OLED.

The thin film encapsulation layer E may include at least one sandwich structure in which at least one organic layer is inserted between at least two inorganic layers. In an implementation, the thin film encapsulation layer E may include at least one sandwich structure in which at least one inorganic layer is inserted between at least two organic layers. In an implementation, the thin film encapsulation layer E may include a sandwich structure in which at least one organic layer is inserted between at least two inorganic layers, and a sandwich structure in which at least one inorganic layer is inserted between at least two organic layers.

The thin film encapsulation layer E may sequentially include a first inorganic layer, a first organic layer, and a second inorganic layer on the OLED.

In an implementation, the thin film encapsulation layer E may sequentially include a first inorganic layer, a first organic layer, a second inorganic layer, a second organic layer, and a third inorganic layer on the OLED.

In an implementation, the thin film encapsulation layer E may sequentially include a first inorganic layer, a first organic layer, a second inorganic layer, a second organic layer, a third inorganic layer, a third organic layer, and a fourth inorganic layer on the OLED.

A halogenated metallic layer including LiF may be additionally arranged between the OLED and the first inorganic layer. The halogenated metallic layer may prevent the OLED from being damaged while the first inorganic layer is formed by sputtering.

The first organic layer may have a narrower area than that of the second inorganic layer. The second organic layer may have a narrower area than that of the third inorganic layer.

Therefore, the display device 20 may include the intermediate layer 28b forming a fine pattern, the intermediate layer 28b is deposited at an accurate location, and thus an accurate image may be produced. Also, the intermediate layer 28b forms a constant pattern even when the intermediate layer 28b is repeatedly deposited, and the display device 20 provides uniform quality during continuous production.

By way of summation and review, as parts for driving display devices are miniaturized, importance of the display devices in electronic apparatuses may gradually increase, and a structure in which the display devices are bendable and have a predetermined angle from a flat state may be considered.

In forming a high resolution display device, a thickness of a mask for deposition used for depositing a deposition material on a display substrate may gradually become thin. For example, the rigidity of the mask for deposition may lower and when tensile force is applied to opposite ends of the mask for deposition, arrangement of pattern holes may be transformed and consequently a pattern of a deposition material deposited on the display substrate may be transformed.

The embodiments may provide a mask having increased rigidity.

According to a mask for deposition, a method of manufacturing the mask, and a method of manufacturing a display device, rigidity of the mask for deposition may be increased.

Also, according to an embodiment, in the case where the mask for deposition is coupled to a frame with tensile force applied to opposite ends of the mask for deposition, the arrangement of the pattern holes may be prevented from being transformed.

Also, according to an embodiment, a deposition material may be deposited in the same or similar pattern over an entire region of a display substrate.

Also, according to an embodiment, a high resolution display device may be manufactured by depositing a deposition material a display substrate in a uniform pattern.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A mask for deposition, the mask comprising:
   a first rib portion having a first thickness; and
   a pattern portion including:
      a plurality of pattern holes, and
      at least one etch portion, the at least one etch portion having a second thickness that is less than the first thickness and directly connecting some of the plurality of pattern holes,
   wherein some of the plurality of pattern holes are disposed in a rhombus shape.

2. The mask as claimed in claim 1, wherein the pattern portion further includes at least one pattern recess having a third thickness that is less than the second thickness.

3. The mask as claimed in claim 2, wherein:
   the at least one pattern recess includes a plurality of pattern recesses, and
   the plurality of pattern recesses are disposed in a rhombus shape.

4. The mask as claimed in claim 2, wherein:
   the at least one pattern recess includes a plurality of pattern recesses, and
   each pattern hole is between adjacent pattern recesses from among the plurality of pattern recesses.

5. The mask as claimed in claim 1, wherein:
   the at least one etch portion includes a plurality of etch portions, and
   the plurality of etch portions are spaced apart from each other in a first direction.

6. The mask as claimed in claim 1, wherein:
   the at least one etch portion includes a plurality of etch portions extending along a first direction, and
   the plurality of etch portions are spaced apart from each other in a second direction crossing the first direction.

7. The mask of claim 1, wherein the at least one etch portion includes:
   a first etch portion extending along a first direction; and
   a second etch portion extending along a second direction that crosses the first direction.

8. The mask as claimed in claim 7, wherein the first etch portion crosses the second etch portion.

9. The mask as claimed in claim 1, wherein the at least one etch portion has a zigzag shape extending along a first direction or a second direction that crosses the first direction.

10. The mask as claimed in claim 9, wherein the plurality of pattern holes are disposed at vertices of the zigzag shape.

11. The mask as claimed in claim 1, wherein the pattern portion has a thickness that is equal to or less than the first thickness.

12. The mask as claimed in claim 1, wherein the pattern portion includes a second rib portion in a region other than the plurality of pattern holes and the at least one etch portion, the second rib portion having a thickness that is greater than the second thickness of the at least one etch portion.

13. A method of manufacturing a display device by using a mask for deposition, the method comprising:
   inserting a display substrate and the mask for deposition into a chamber; and depositing a deposition material over the display substrate, the deposition material being sprayed from a deposition source and passing through the mask for deposition, wherein the mask for deposition includes:

a first rib having a first thickness; and a pattern portion including:

a plurality of pattern holes, and at least one etch portion, the at least one etch portion having a second thickness that is less than the first thickness and connecting between some of the plurality of pattern holes, and wherein some of the plurality of pattern holes are disposed in a rhombus shape.

14. The method as claimed in claim 13, wherein the pattern portion further includes at least one pattern recess having a third thickness that is less than the second thickness.

15. The method as claimed in claim 14, wherein:

the at least one pattern recess includes a plurality of pattern recesses, and the plurality of pattern recesses are arranged in a rhombus shape.

16. The method as claimed in claim 14, wherein:

the at least one pattern recess includes a plurality of pattern recesses, and each pattern hole is disposed between adjacent pattern recesses from among the plurality of pattern recesses.

17. The method as claimed in claim 13, wherein:

the at least one etch portion includes a plurality of etch portions, and the plurality of etch portions are spaced apart from each other in a first direction.

18. The method as claimed in claim 13, wherein:

the at least one etch portion includes a plurality of etch portions, and the plurality of etch portions are spaced apart from each other in a second direction crossing a first direction.

19. The method as claimed in claim 13, wherein the at least one etch portion includes:

a first etch portion extending along a first direction; and a second etch portion extending along a second direction that crosses the first direction.

20. The method as claimed in claim 19, wherein the first etch portion crosses the second etch portion.

21. The method as claimed in claim 13, wherein the at least one etch portion has a zigzag shape extending along a first direction or a second direction that crosses the first direction.

22. The method as claimed in claim 21, wherein the plurality of pattern holes are disposed at vertices of the zigzag shape.

23. The method as claimed in claim 13, wherein the pattern portion has a thickness that is equal to or less than the first thickness.

24. The method as claimed in claim 13, wherein the pattern portion includes a second rib portion in a region other than the pattern hole and the etch portion, the second rib portion having a thickness that is greater than the second thickness of the at least one etch portion.

25. A method of manufacturing a display device by using a mask for deposition, the method comprising:

inserting a display substrate and the mask for deposition into a chamber; and depositing a deposition material over the display substrate, the deposition material being sprayed from a deposition source and passing through the mask for deposition, wherein the mask for deposition includes:

a first rib having a first thickness; and a pattern portion including:

a plurality of pattern holes, and at least one etch portion, the at least one etch portion having a second thickness that is less than the first thickness and connecting between some of the plurality of pattern holes, and wherein the at least one etch portion has a zigzag shape extending along a first direction or a second direction that crosses the first direction.

26. A mask for deposition, the mask comprising:

a first rib portion having a first thickness; and a pattern portion including:

a plurality of pattern holes, and at least one etch portion, the at least one etch portion having a second thickness that is less than the first thickness and connecting between some of the plurality of pattern holes, wherein the at least one etch portion has a zigzag shape extending along a first direction or a second direction that crosses the first direction.

27. A mask for deposition, the mask comprising:

a first rib portion having a first thickness; and a pattern portion including:

a plurality of pattern holes, and at least one etch portion, the at least one etch portion having a second thickness that is less than the first thickness and connecting between some of the plurality of pattern holes, wherein the at least one etch portion includes:

a first etch portion extending along a first direction; and a second etch portion extending along a second direction that crosses the first direction, wherein the first etch portion crosses the second etch portion.

28. A method of manufacturing a display device by using a mask for deposition, the method comprising:

inserting a display substrate and the mask for deposition into a chamber; and depositing a deposition material over the display substrate, the deposition material being sprayed from a deposition source and passing through the mask for deposition, wherein the mask for deposition includes:

a first rib having a first thickness; and a pattern portion including:

a plurality of pattern holes, and at least one etch portion, the at least one etch portion having a second thickness that is less than the first thickness and connecting between some of the plurality of pattern holes, and wherein the at least one etch portion includes:

a first etch portion extending along a first direction; and a second etch portion extending along a second direction that crosses the first direction, wherein the first etch portion crosses the second etch portion.

* * * * *